United States Patent [19]
Shinzawa

[11] Patent Number: 6,009,255
[45] Date of Patent: Dec. 28, 1999

[54] METHOD OF DEPOSITION PROFILE SIMULATION

[75] Inventor: Tsutomu Shinzawa, Tokyo, Japan

[73] Assignee: NEC Corporation, Tokyo, Japan

[21] Appl. No.: 08/915,144

[22] Filed: Aug. 20, 1997

[30] Foreign Application Priority Data

Aug. 21, 1996 [JP] Japan ..................................... 8-219901

[51] Int. Cl.$^6$ .................................................. G06F 17/50
[52] U.S. Cl. .............................. 395/500.27; 395/500.23
[58] Field of Search ......................... 395/500.33, 500.23, 395/500.27, 500.21; 364/468.28; 702/26; 708/809

[56] References Cited

U.S. PATENT DOCUMENTS

| | | | |
|---|---|---|---|
| 5,282,140 | 1/1994 | Tazawa et al. ........................... | 364/468 |
| 5,580,428 | 12/1996 | Krivokapic et al. ................ | 204/192.12 |
| 5,586,230 | 12/1996 | Leon et al. ............................... | 395/120 |
| 5,590,051 | 12/1996 | Yokozawa ................................ | 364/496 |

OTHER PUBLICATIONS

M. M. IslamRaja et al., "A 3–dimensional model for low–pressure chemical–vapor deposition step coverage in trenches and circular vias", Journal of Applied Physics 70(11), Dec. 1, 1991, pp. 7137–7140.

J.J. Hsieh, "Influence of surface–activated reaction kinetics on low–pressure chemical vapor deposition conformality over micro features", Journal of Vacuum Science and Technology A 11(1), Jan./Feb. 1993, pp. 78–86.

Primary Examiner—Kevin J. Teska
Assistant Examiner—Thai Phan
Attorney, Agent, or Firm—Whitham, Curtis & Whitham

[57] ABSTRACT

To provide a simulation method of estimating deposition profile of a contact hole with a high-speed, a simulation method of the invention comprises a step of calculating a flux density incident directly from a gas phase onto each surface point of the contact hole making use of an analytical integration, and a step of calculating shape factors for each pair of two surface points of the contact hole describing flux exchange between the two surface point, making use of another analytical integration.

2 Claims, 5 Drawing Sheets

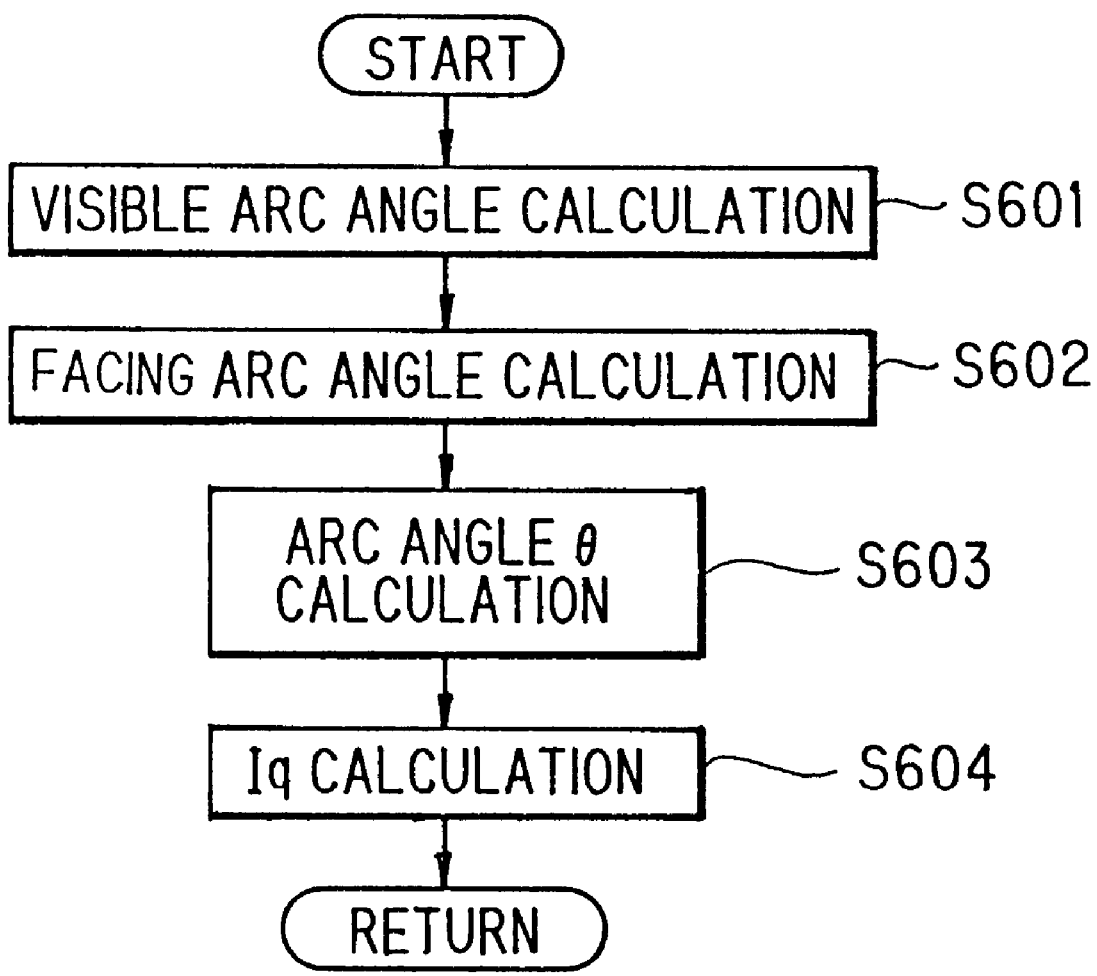

METHOD OF DEPOSITION PROFILE SIMULATION

BACKGROUND OF THE INVENTION

The present invention relates to a method of deposition profile simulation, and particularly to a simulation method to be applied for estimating microscopic profile of an axis-symmetrical structure, such as a contact hole, provided on VLSI (Very Large Scale Integrated) circuits after deposition processing, with a calculation time comparatively short making use of analytical integration.

There have been proposed several simulation methods for estimating profile evolution of trenches and contact holes in CVD (Chemical Vapor Deposition) processes. Examples of them are described in a paper entitled "A 3-dimensional model for low-pressure chemical-vapor-deposition step coverage in trenches and circular vias", by M. M. IslamRaja et al., pp. 7137 to 7140, Journal of Applied Physics 70 (11), December 1991, and a paper entitled "Influence of surface-activated reaction kinetics on low-pressure chemical vapor deposition conformality over micro features", by J. J. Hsieh, pp. 78 to 86, Journal of Vacuum Science and Technology A 11(1), January/February 1993.

In these papers, following assumptions are applied, considering that dimension of a mean-free path of a molecule in the rarefied species gas is sufficiently larger than dimension of the contact hole, for example, since inter-collision probability of the gas molecules is very small in the condition generally applied for metal CVD processes, and so, the gas molecules can be treated to arrive straight on the substrate surface from a region in a mean-free path length around the substrate surface.

1. There is but negligible inter-collisions of the gas molecules in the region of interest.

2. Molecules in the gas phase act as those of an ideal gas having a uniform molecule density with their speed following the Maxwellian distribution, and the internal freedom degree of the molecules can be neglected.

3. Directional distribution of the molecules re-emitted at the substrate surface is isotropic, since the molecules attain a thermal equilibrium on the substrate surface, losing information of their incident angles.

4. Diffusion from the substrate surface is negligible.

5. Value of the reactive sticking coefficient (hereafter abbreviated as Sc) is independent of location, that is, independent of flux density or surface conditions.

6. Sc of the incident flux is deposited and all of the other, that is (1−Sc) of the incident flux is re-emitted.

In the simulation methods of deposition profile described in the above papers, the deposition speed is obtained by calculating incident flux densities, regarding the deposition speed at a surface position to be proportional to the incident flux density at the surface position. Sc of the incident flux at a surface position, which is a sum of flux from the rarefied species gas and the flux re-emitted at the other surface positions, being deposited on the surface position, and the other of the incident flux being reflected to the other surface positions, the profile evolution at each surface position is calculated so that material income and expenses corresponding to the incident flux and the re-emitted flux should balance at each surface position in each time step.

However, as for the calculation method for obtaining value of the incident flux, there is no concrete description in the paper of M. M. IslamRaja et al., and in the paper of J. J. Hseih, there is described but a method applicable only for deposition profile of the trenches.

As for "shape factors" which describe the incident flux re-emitted from the other surface positions, they are represented by a following equation in the paper of M. M. IslamRaja et al., which can not be applied, however, directly to the trenches or the contact holes.

$$F_{ji-\cos \psi_j} \cos \psi_i dA_j dA_i / \pi r^2_{ij}$$

where;

$F_{ji}$ are shape factors describing the probability that a molecule emitted from a differential area element $dA_j$ at a surface position $r_j$ (from a suitable point of origin) strikes a region within the differential area $dA_i$ at another surface position $r_i$, cos $\psi$ represents the directional cosine, and $r_{ij}$ is the magnitude of the vector represented by $r_j-r_i$.

In the paper of J. J. Hsieh, on the other hand, they are represented by a following equation, which is applicable, however, only to the trenches and furthermore, expressed only with visible angles $S_{i,j}$ inconvenient to be applied in actual calculation.

$$\Omega_{i,j} = (1 - \Delta_{i,j}) \int_{S_{i,j}} \frac{\cos(\omega - \omega_i)}{2} d\omega$$

where;

$\Omega_{i,j}$ is the jth edge visibility on the ith edge, $\omega_i$ is the surface normal angle on the ithe edge of the 2-dimensional cross section of a micro feature, and $\Delta_{i,j}$ is the Dirac Delta function.

In summary, there are disclosed fundamental equations concerning to the trenches and contact holes for defining the incident flux from gas phase and other surface positions in the prior arts, but they are not concrete in the paper of M. M. IslamRaja et al., or not convenient to be applied to the string model analysis, in the paper of J. J. Hsieh.

However, it is indispensable to calculate and integrate the flux density incident to each differential section of a 3-dimensional string model for estimating the deposition profile, and computational time depends deeply on the integration method.

SUMMARY OF THE INVENTION

Therefore, a primary object of the present invention is to provide a simulation method of deposition profile, wherein profile estimation of an axis-symmetrical structure, such as a contact hole, can be performed with a high-speed and a high accuracy making use of analytical integration for calculating the incident flux.

In order to achieve the object, in a method of deposition profile simulation according to the invention including a step of direct flux calculation for calculating a flux density incident directly from a gas phase onto each surface point of the axis-symmetrical structure, and a step of shape factor calculation for calculating shape factors, each of said shape factors describing contribution of re-emitted flux which is re-emitted from a first surface point and incident onto a second surface point for each pair of the first surface point and the second surface point of the axis symmetrical structure; said step of direct flux calculation comprises steps of:

calculating a starting angle and an ending angle, the starting angle and the ending angle representing a maximum value and a minimum value, respectively, of an elevation angle with which the gas phase is visible from the surface point, said elevation angle representing an angle of a plane including the surface point relative to a center axis of the axis-symmetrical structure; and numerically integrating direct flux incident onto the surface point from the gas phase by calculating and accumulating a differential component of the direct flux corresponding to each value of the elevation angle from the starting angle to the ending angle, said differential component being calculated making use of an analytical function of the elevation angle, coordinates of the surface point, coordinates of a circumference shadowing the differential component, and a surface direction at the surface point.

Further, in the method of deposition profile simulation according to the invention, said step of shape factor calculation comprises steps of:

calculating a visible arc angle representing an angle of a line including an end of a visible arc and perpendicular to a center axis of the axis-symmetrical structure relative to a first plane including the second surface point and the center axis, said visible arc being a visible part, from the second surface point, of a circumference of the axis-symmetrical structure sectioned with a second plane perpendicular to the center axis and including the first surface point;

calculating a facing arc angle representing an angle of a line including an end of a facing arc and perpendicular to the center axis relative to the first plane, said facing arc being a part of the circumference where a scalar product of a surface direction of the first surface point and a vector from the second surface point to the first surface point and a scalar product of a surface direction of the second surface point and a vector from the first surface point to the second surface point are both positive;

determining a smaller value of the visible arc angle and the facing arc angle as an arc angle; and calculating said each of space factor making use of an analytical function of the arc angle, coordinates of the first surface point and the second surface point, and surface directions at the first surface point and the second surface point.

Therefore, evolution of deposition profile of an axis-symmetrical structure, such as a contact hole, can be estimated with a high-speed and a high accuracy in the simulation method according to the invention.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings:

FIG. 6 is a flowchart illustrating calculation method of an arc angle θ and a shape factor.

DETAILED DESCRIPTION OF THE PREFERRED EMBODIMENTS

Now, embodiments of the present invention will be described in connection with the drawings.

Figure 1:
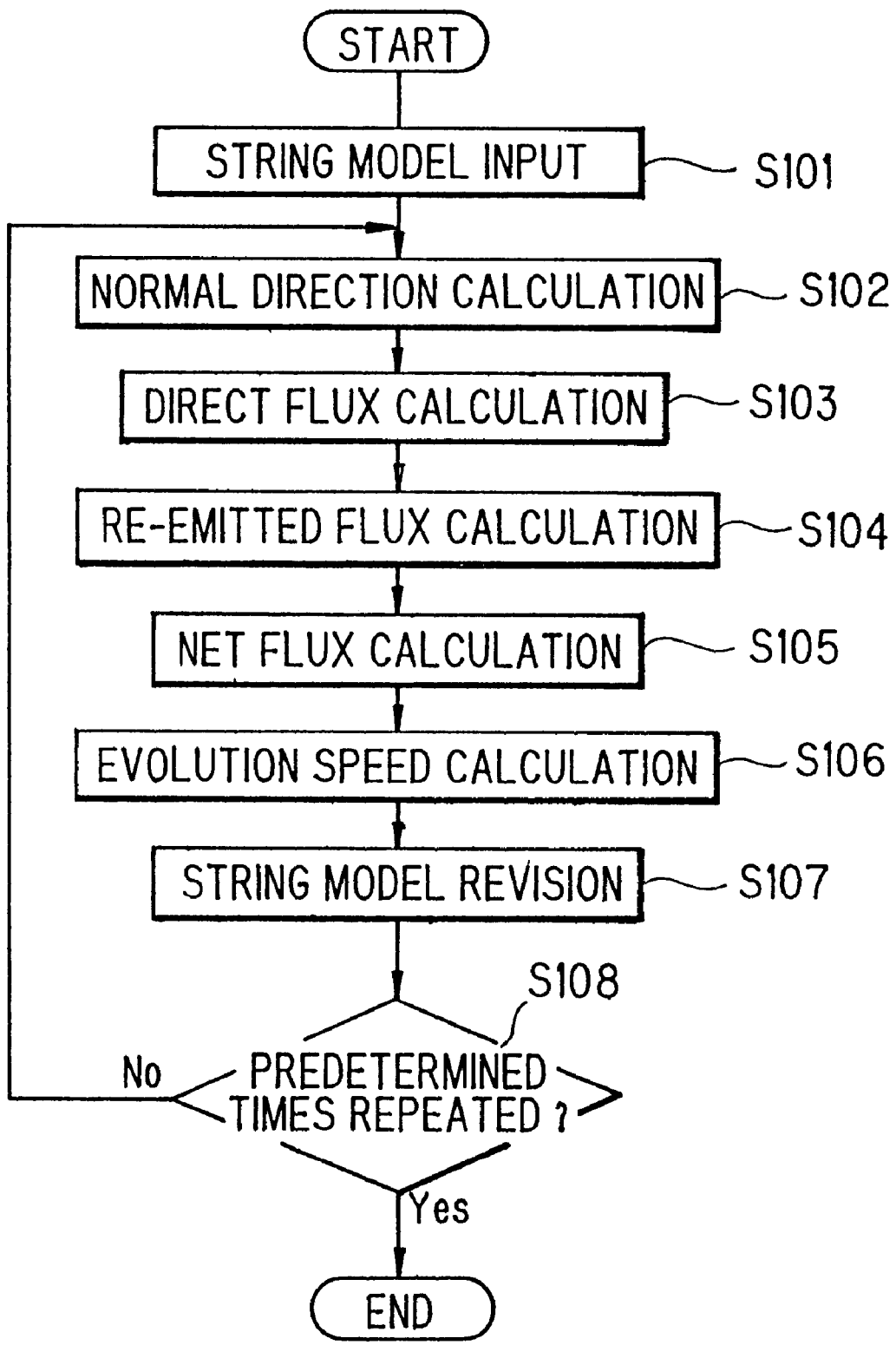
FIG. 1 is a flowchart illustrating a process flow of the simulation method according to an embodiment of the invention.

FIG. 1 is a flowchart illustrating a process flow of the simulation method according to an embodiment of the invention.

At the beginning, a string model representing a semiconductor wafer is supplied (at Step S101).

For each of strings of the string model, which is to evolve towards the gas phase, a normal direction is calculated (at Step S102).

Then, the direct flux from the gas phase incident onto each of the strings is calculated (at Step S103), which can be defined uniquely as will be described afterwards.

Then, the re-emitted flux from other surface positions incident onto each of the strings is calculated (at Step S104). Here, values of the net flux incident onto other surface positions being treated as unknown variables, the "shape factors" corresponding to in-out balances of the flux exchanged among the surface positions are calculated.

Then (at Step S105), the net flux $J_i$ (i=1, 2, ... ) incident onto each of the strings, which has been treated as a variable at Step S104, is obtained by solving simultaneous linear equations defined at Step S104.

Then, evolution speed $k=M/\rho J_i$ of the deposited coverage is calculated (at Step S106) with the molecular weight M and the density ρ of the deposited material from of the net flux $J_i$ obtained at Step S105.

And, coordinates of each of the strings are revised (at Step S107) according to the evolution speed k obtained at Step S106.

It is checked whether Steps S102 to S107 are performed predetermined times or not (at Step S108), and the process flow returns to Step S102 until Steps S102 to S107 are repeated the predetermined times.

Thus, the deposition profile evolution is estimated in the embodiment.

Now, detailed processes at S103 for calculating the direct flux from the gas phase are described.

Figure 2:
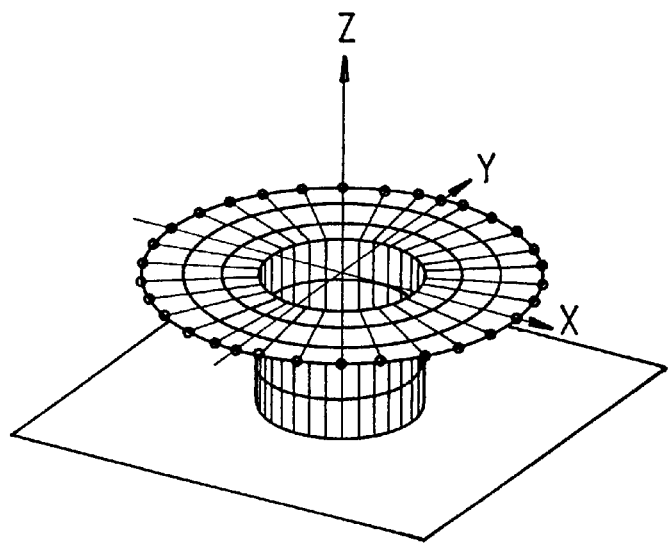
FIG. 2 is a perspective view illustrating a string model representing a contact hole and its coordinate axes X, Y and Z.
Figure 3:
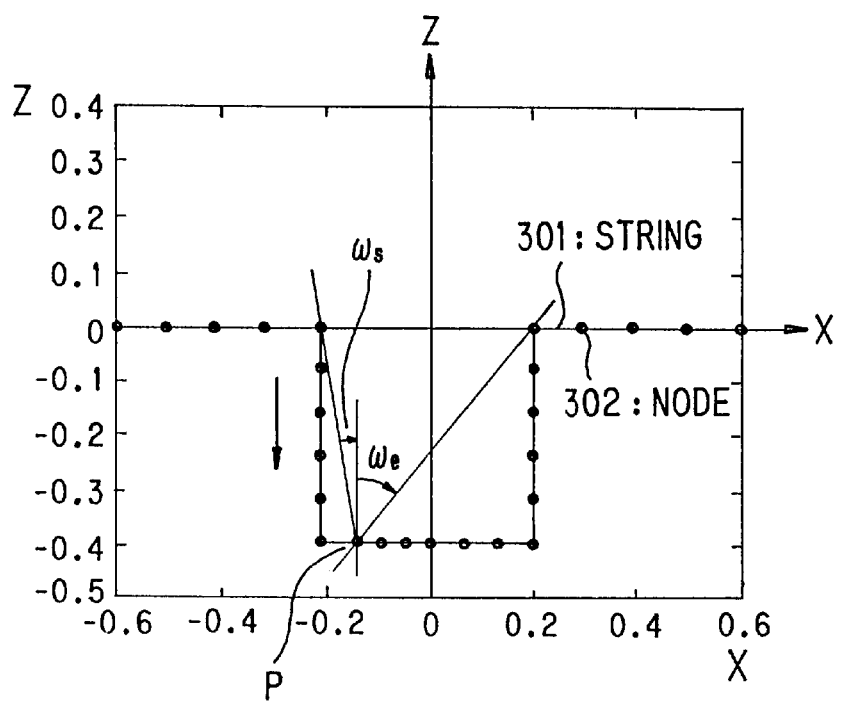
FIG. 3 is a cross section illustrating X-Z plane of the string model of FIG. 2.

FIG. 2 is a perspective view illustrating a string model representing a contact hole and its coordinate axes X, Y and Z, wherein Z axis represents the center axis of the contact hole provided on a wafer surface represented by X-Y plane. FIG. 3 is a cross section illustrating X-Z plane of the string model of FIG. 2.

The three-dimensional structure of the contact hole is symmetrical to the Z axis as shown in FIG. 2. Therefore, flux balances at all parts of the three-dimensional contact hole surface can be represented by those at two-dimensional strings on the X-Z plane as shown in FIG. 3, wherein each string 301 is connected at its end to an adjacent string with each node 302. As the contact hole is symmetrical to the Z axis, each node 302 corresponds to a circumference of the contact hole on a plane parallel to the X-Y plane, and each string 301 corresponds to a conic band defined by adjacent two circumferences of the contact hole.

Figure 4:
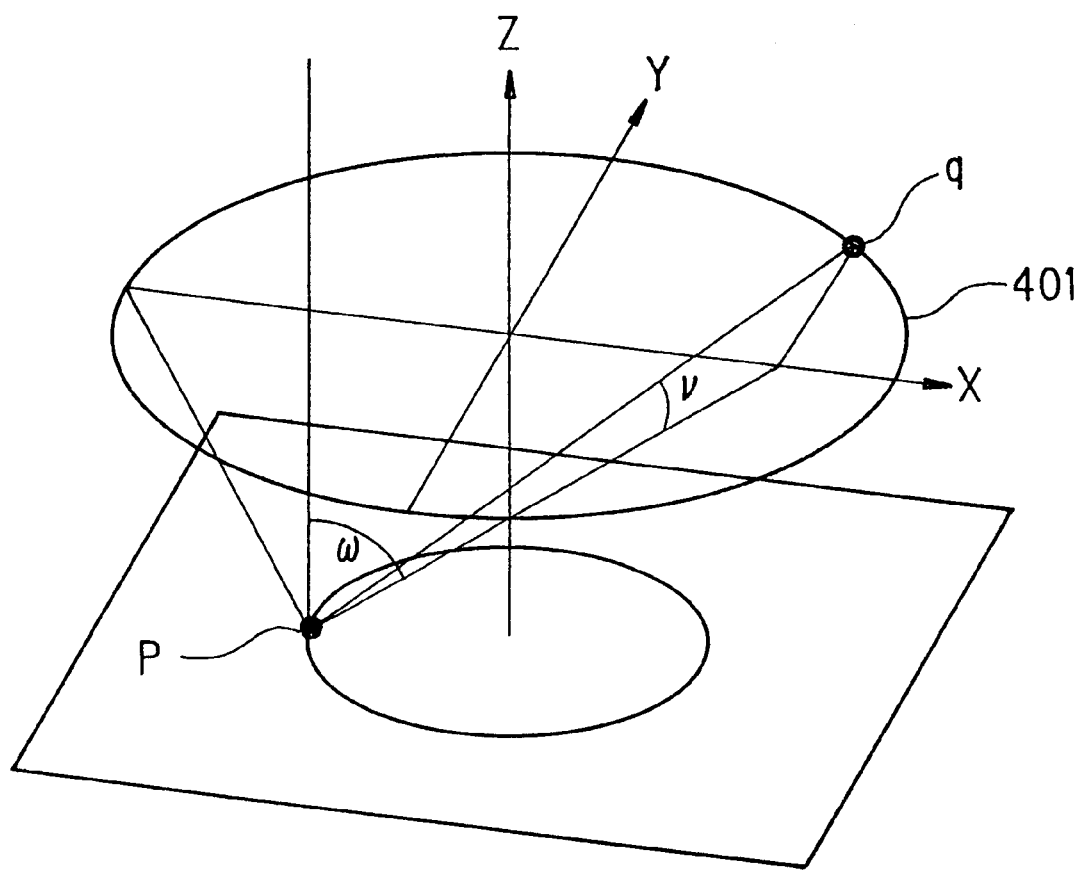
FIG. 4 is a schematic diagram illustrating an opening angle to be applied for obtaining direct flux from the gas phase.

FIG. 4 is a schematic diagram illustrating an opening angle to be applied for obtaining direct flux from the gas phase, wherein the direct flux arrives onto a point p on a string through the opening of the contact hole represented by a circumference 401 on the X-Y plane.

Outside of the contact hole, there is no restriction to shadow the direct flux, and so, the direct flux can be integrated from $-\pi/2$ to $\pi/2$ concerning to opening angle $\upsilon$ to the X-Z plane of the direct flux. On the other hand, the opening angle $\upsilon$ to the X-Z plane is limited by the circumference 401 for the point p in the contact hole, depending on elevation angle $\omega$ of the direct flux to the Y-Z plane.

Therefore, the direct flux incident onto the point p is integrated as follows:

$$J_{gas}(r_p) = \int_{\omega_s}^{\omega_e} \int_{-\nu(\omega)}^{\nu(\omega)} I_{gas}(r_p, \nu, \omega) i_{\nu,\omega} \cdot n_p \cos \nu \, d\nu \, d\omega. \qquad (1)$$

Here;

$J_{gas}(r_p)$: density of the direct flux incident onto the point p at coordinates $r_p$;

$I_{gas}(r_p, \upsilon, \omega)$: flux intensity incident onto the point p from a direction $(\upsilon, \omega)$;

$i_{\upsilon,\omega}$: unit vector of the direction $(\upsilon,\omega)$;

$n_p$: normal direction of the surface at the point p;

$\omega_s$: starting angle from which the gas phase becomes visible from the point p;

$\omega_e$: ending angle until which the gas phase is visible from the point p;

$\upsilon(\omega)$: opening angle (at the elevation angle $\omega$), that is, angle of a section p-q to the X-Z plane, the point q being one of two intersection points between the circumferance 401 and a plane parallel to the Y axis, including the point p and inclined with the angle $\omega$ to the Z axis.

When vectors are expressed by (X, Y, Z) coordinates;

$i_{\upsilon,\omega} = (\sin \omega \cos \upsilon, \sin \upsilon \cos \omega \cos \upsilon)$, and $n_p = (\sin \omega_p, 0, \cos \omega_p)$, where, $\omega_p$ is an angle of the normal direction $n_p$ to the Z axis.

So, $i_{\upsilon,\omega} \cdot n_p \cos \upsilon = \cos^2 \upsilon \cos(\omega - \omega_p)$ and substituting this equation for the equation (1), the density of the direct flux $J_{gas}(r_p)$ is expressed as follows;

$$J_{gas}(r_p) = \int_{\omega_s}^{\omega_e} \int_{-\nu(\omega)}^{\nu(\omega)} I_{gas}(r_p, \nu, \omega)\cos(\omega - \omega_p)\cos^2 \nu \, d\nu \, d\omega \qquad (2)$$

$$= I \int_{\omega_s}^{\omega_e} \left( \nu(\omega) + \frac{\sin 2\nu(\omega)}{2} \right) \cos(\omega - \omega_p) d\omega,$$

when the flux intensity $I_{gas}(r_p, \upsilon, \omega)$ can be regarded as a constant I independent of the direction $(\upsilon, \omega)$ and the coordinates $r_p$.

The equation (2) shows that the density of the direct flux $J_{gas}$ can be calculated numerically from the starting angle $\omega_s$, the ending angle $\omega_e$ and the maximum opening angle $\upsilon(\omega)$ at the elevation angle $\omega$ between the starting angle $\omega_s$ and the ending angle $\omega_e$.

Thus, the direct flux integration concerning to the opening angle $\upsilon$ can be calculated analytically in the embodiment, reducing the computational time remarkably.

Figure 5:
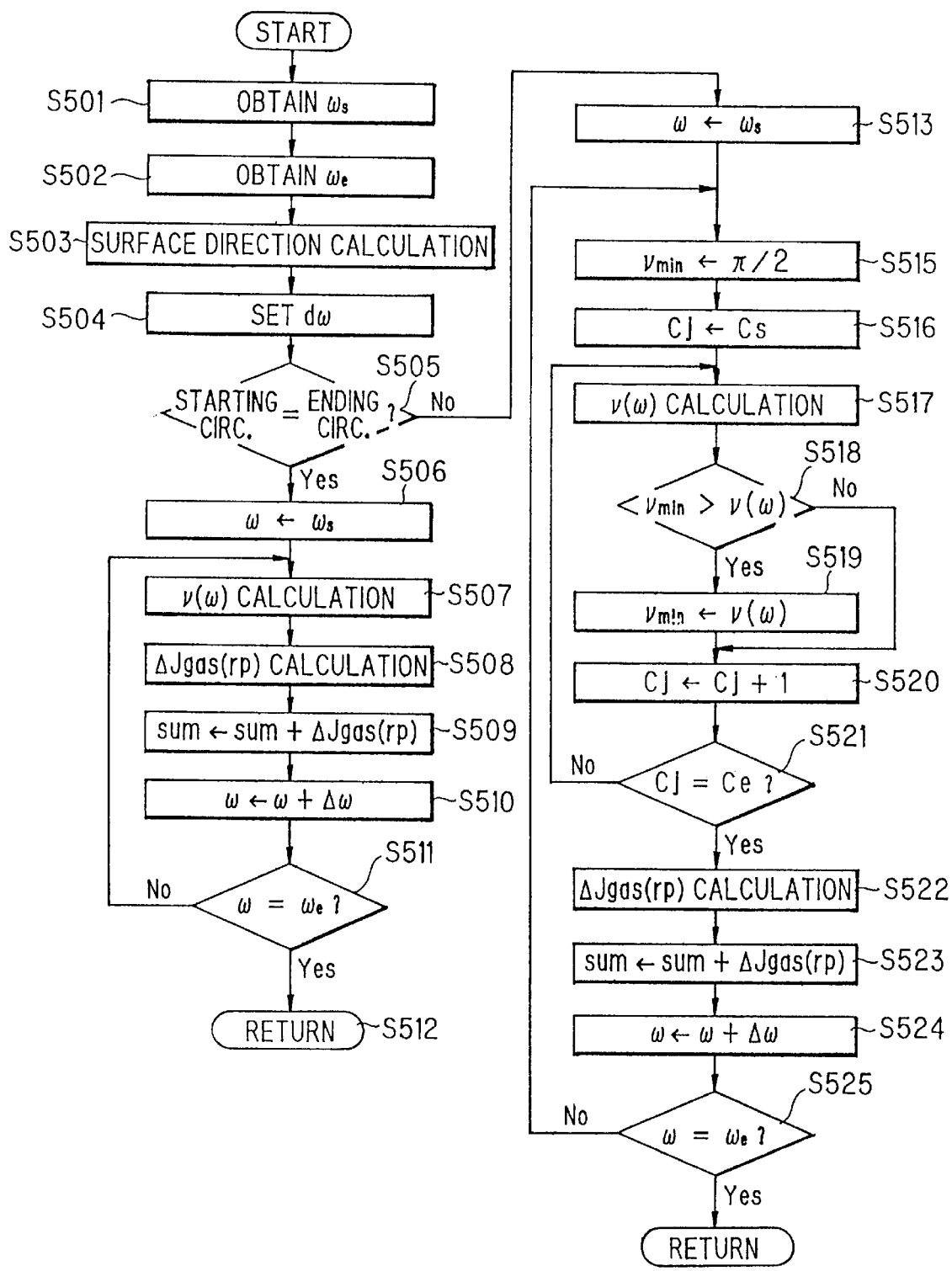
FIG. 5 is a flowchart illustrating calculation method of the density of the direct flux $J_{gas}$.

Now, calculation method of the density of the direct flux $J_{gas}$ according to the equation (2) is described referring to a flowchart of FIG. 5.

First, the starting $\omega_s$ and the ending angle $\omega_e$ are searched (at Steps S501 and S502). Referring to the X-Z plane of FIG. 2, among clockwise angles to the Z axis of lines from the point p to visible nodes, a maximum angle to a node ranged preceding the point p is set to the starting angle $\omega_s$ and a minimum angle to a node following the point p is set to the ending angle $\omega_e$.

Then, the angle $\omega_p$ to the Z axis of the normal direction of the surface at the point p is calculated (at Step S503).

Then, a differential angle $d\omega$ is set (at Step S504) for the numerical integration from the starting angle $\omega_s$ to the ending angle $\omega_e$. Here, the differential angle $d\omega$ may be $\frac{1}{50}$ to $\frac{1}{200}$, for example, of $\omega_s - \omega_e$, or 0.2° to 1.0° according to desired accuracy.

Then, it is checked (at Step S505) whether the two nodes defining the starting angle $\omega_s$ and the ending angle we belong to the same circumferance or not, that is, whether the two nodes have the same Z coordinates or not.

In case where the starting angle $\omega_s$ and the ending angle $\omega_e$ are defined with the same circumference, the elevation angle $\omega$ is initialized to the starting angle $\omega_s$ (at Step S506), and the maximum opening angle $\upsilon(\omega)$ corresponding to the elevation angle $\omega$ is calculated (at Step S507) as follows.

Coordinates of the intersection point q and the point p being expressed as $(q_r \cos \theta, q_r \sin \theta, z_q)$ and $(-p_r, 0, z_p)$, respectively, the maximum opening angle $\upsilon(\omega)$ is defined by following equation from geometrical relation between the plane parallel to the Y axis, including the point p and inclined with the angle $\omega$ to the Z axis, and its intersection point q with the circumferance 401.

$$\nu(\omega) = \arccos\left( \frac{(z_p - z_q)\sec\theta}{\sqrt{q_r^2 - p_r^2 + 2p_r(z_q - z_p)\tan\omega + (z_q - z_p)^2}} \right),$$

where;

$q_r$ and $-p_r$: radiuses of the circumferance 401 and X coordinates of the point p, respectively; and $\theta$: angle of the vector $r_q$ to the X axis.

Then, a deferential of the direct flux $J_{gas}(r_p)$ at the elevation angle $\omega$ is calculated (at Step S508) to be integrated (at Step S509) by substituting integrand of the equation (2) with the elevation angle $\omega$ and the maximum opening angle $\upsilon(\omega)$.

Then, revising the elevation angle $\omega$ (at Step S510), Steps S507 to S510 are repeated until the elevation angle $\omega$ is detected (at Step S511) to arrive the ending angle $\omega_e$.

In case where the starting angle $\omega_s$ and the ending angle $\omega_e$ are defined with two different circumferences $C_s$ and $C_e$, the control process goes to Step S513 and the elevation angle $\omega$ is initialized to the starting angle $\omega_s$ in the same way at Step S506.

Here, before calculating (at Step S522) the differential component of the direct flux $J_{gas}(r_p)$ as is performed at Step S508, a minimum value of the maximum opening angle $\upsilon(\omega)$ is searched (at Steps S515 to S521) for each elevation angle $\omega$ among maximum opening angles $\upsilon(\omega)$ corresponding to circumferences defined by nodes from that of the starting circumference $C_s$ to that of the ending circumference $C_e$.

At Step S522, the minimum value of the maximum opening angle $\upsilon(\omega)$ is substituted to the integrand of the equation (2), and the direct flux $J_{gas}(r_p)$ is integrated (at Step S523) until the elevation angle arrives to the ending angle $\omega_e$ (at Steps S524 and S525) in the similar way by repeating Steps S515 to S525.

Thus, the direct flux $J_{gas}(r_p)$ is calculated in the embodiment.

Now, contribution of the flux re-emitted from other surface positions calculated at Step S104 of FIG. 1 is described.

As the structure of the contact hole is symmetrical to the Z axis, net flux density incident onto a small space at the same Z coordinates should have the same value. Therefore, re-emitted flux from a small space on the same narrow conic band, or on the same circumferance, should have the same intensity and can be defined by a two-dimensional analysis concerning to the small space corresponding to a string on the half X-Z plane (in a domain $X \leq 0$, for example).

Furthermore, as will be described afterwards, the flux incident onto a small space re-emitted from each circumferance can be analytically integrated concerning to arc angle around the Z axis of the circumference visible from the small space. Therefore, computational time can be remarkably reduced, here too, in the embodiment.

Denoting the net flux at a string i (i=1, ..., p, ..., q, ..., n) as $J_i$, the contribution $J_p - J_{qp}$, where $J_{gp} = J_{gas}(r_p)$ calculated at Step S103, of the flux incident onto a point p re-emitted from other surface is represented by following equation.

$$J_p - J_{gp} = \sum_{q=1}^{n} \int_{-\theta_0}^{\theta_0} (J_q - R_q) \frac{(n_p \cdot r_{pq})(n_q \cdot r_{qp})}{\pi r_{pq}^4} ds_q. \quad (3)$$

Here;

$R_q$: flux density depositted on a string q at coordinates ($x_q \cos \theta$, $x_q \sin \theta$, $z_q$);

$r_{pq} = -r_{qp}$: vector from the string q to a string p at coordinates ($-x_p$, 0, $z_p$);

$n_p$: normal direction ($n_{px}$, 0, $n_{pz}$) of the surface at the string p;

$n_q$: normal direction ($n_{qx} \cos \theta$, $n_{qx} \sin \theta$, $n_{qz}$) of the surface at the string q;

$ds_q = x_q d\theta ls_q$: $d\theta$ being differential angle concerning to the string q and $ls_q$ being string length of the string q; and $\theta_0$, $-\theta_0$: beginning and ending angle around the Z axis of a visible arc of the circumferance including the string q.

So;

$n_p \cdot r_{qp} = (x_p + x_q \cos \theta) n_{px} + (z_q - z_p) n_{pz}$ $n_q \cdot r_{pg} = (x_p + x_q \cos \theta) n_{qz} + (z_q - z_p) n_{qz}$ $r_{pq}^4 = \{x_p^2 + x_q^2 + 2 x_p x_q \cos \theta + (z_p - z_q)^2\}^2$ Therefore, the equation (3) is expressed as;

$$J_p - J_{gp} = \sum_{q=1}^{n} x_q ls_q (J_q - R_q) \times$$

$$\int_{-\theta_0}^{\theta_0} \frac{\{(x_p + x_q \cos \theta) n_{px} + (z_q - z_p) n_{px}\}\{-(x_p + x_q \cos \theta) n_{qx} + (z_q - z_p) n_{qz}\}}{\pi \{x_p^2 + x_q^2 + 2 x_p x_q \cos \theta + (z_p - z_q)^2\}^2}.$$

Coordinate components other than $\theta$ being replaced as follows;

$\alpha_1 = x_p n_{px} + (z_q - z_p) n_{px}$ $\beta_1 = x_q n_{px}$ $\alpha_2 = -x_1 n_{qz} + (z_p - z_q) n_{qz}$ $\beta_2 = -x_p n_{qw}$ $\alpha_3 = x_p^2 + x_q^2 + (z_p + z_q)^2$ $\beta_3 = 2 x_p x_q$ integral term $I_q$ of the equation (3) is expressed with a following equation;

$$I_q = \int_{-\theta_0}^{\theta_0} \frac{(\alpha_1 + \beta_1 \cos \theta)(\alpha_2 + \beta_2 \cos \theta)}{\pi(\alpha_3 + \beta_3 \cos \theta)^2} d\theta.$$

When $\tan \theta/2$ is replaced with t;

$$I_q = \frac{\beta_1 \beta_2}{\beta_3}(\alpha_3 - \beta_3)^2 \int \frac{dt}{1+t^2} +$$

$$\left((\alpha_1 - \beta_1)(\alpha_2 - \beta_2) - \frac{\beta_1 \beta_2}{\beta_3}(\alpha_3 - \beta_3)^2\right) \int \frac{dt}{\gamma^2 + t^2} +$$

$$\frac{2(\beta_1 \alpha_3 - \alpha_1 \beta_3)(\beta_2 \alpha_3 - \alpha_2 \beta_3)}{\beta_3(\alpha_3 - \beta_3)} \int \frac{dt}{(\gamma^2 + t^2)^2},$$

where;

$$\gamma = \sqrt{\frac{\alpha_3 + \beta_3}{\alpha_3 - \beta_3}}.$$

Thus, integral term $I_q$ of the equation (3) is expresses with three integral terms concerning to t, each able to be calculated analytically.

Replacing t with $\theta$ after the integration, following equation is obtained as a trigonometric function of $\theta$;

$$I_q(\theta) = \frac{\beta_1 \beta_2}{2\beta_3}(\alpha_3 - \beta_3)^2 \theta + \quad (4)$$

$$\left((\alpha_1 - \beta_1)(\alpha_2 - \beta_2) - \frac{\beta_1 \beta_2}{\beta_3}(\alpha_3 - \beta_3)^2\right) \frac{1}{\gamma} \arctan\left(\frac{\tan \frac{\theta}{2}}{\gamma}\right) +$$

$$\frac{2(\beta_1 \alpha_3 - \alpha_1 \beta_3)(\beta_2 \alpha_3 - \alpha_2 \beta_3)}{\beta_3(\alpha_3 - \beta_3)} \frac{1}{2\gamma^2} \left(\frac{1}{\gamma} \arctan\left(\frac{\tan \frac{\theta}{2}}{\gamma}\right) + \right.$$

$$\left. \frac{\tan \frac{\theta}{2}}{\gamma^2 + \tan^2 \frac{\theta}{2}}\right).$$

With the equation (4), the equation (3) can be expressed as follows;

$$J_p = 2 \sum_{q=1}^{n} x_q ls_q (J_q - R_q) I_q(\theta) + J_{gp}. \quad (5)$$

Here, the arc angle $\theta$ of the visible range from a string p of the circumferance corresponding to a string q can be obtained from geographic relation of the string p and the string q on the X-Z plane.

Now, calculation of the arc angle $\theta$ is described referring to a flowchart of FIG. 6.

First, a visible arc angle of the circumference $C_q$, which is limited because of shadowing by another circumference $C_r$, between the string p and the considering circumference $C_q$ corresponding to the string q, is calculated at Step S601.

In a similar way as described in connection with Step S501 and S502 of FIG. 5, consider clockwise angles to the Z axis of lines from the string p to visible strings between two strings, denoted by q and q–, included in the circumferance $C_q$. If there is a string which gives a maximum angle among strings other than the string q– and preceding the string p, or a string which gives a minimum angle among strings other than the string q and following the string p, it is determined to be the string corresponding to the circumferance $C_r$ shadowing the circumferance $C_q$ from the string p.

If there are two strings giving the maximum angle and the minimum angle, whole of the circumferance $C_q$ is shadowed.

When there is a string giving the maximum angle or the minimum angle, two intersection lines between a cone defined by the circumferance $C_q$ and a string p and a cone defined by the circumferance $C_r$ and a string p are calculated. The visible arc angle is obtained from coordinates of one of two symmetric intersection points between the two intersection lines and the circumferance $C_q$, as the angle to the X-Z plane of the perpendicular from the intersection point to the Z axis.

Then, a facing arc angle of the circumference $C_q$, which is limited because of relation between normal directions of the surfaces at the string p and the string q, is calculated (at Step S602).

Flux is not re-emitted backwards and not incident from backwards. Therefore, the numerators $n_p \cdot r_{pq}$ and $n_q \cdot r_{qp}$ of the integrand of equation (3), that is, a scalar product of surface direction at the string p and the vector from the string q to the string p and that of surface direction at string q and the vector from the string p to the string q, should be both positive, limiting the facing arc angle.

Then (at Step S603), a smaller value of the visible arc angle calculated at Step S601 and the facing arc angle calculated at Step S602 is determined as the arc angle θ to be applied in the equation (4).

Thus, the net flux $J_p$ at the string p is expressed (at Step S604) as follows, with n variables $J_q$, n known shape factors $F_{pq}$, a constant Sc representing the reactive sticking coefficient $R_q/J_q$, and the direct flux $J_{qp}$ calculated at Step S103 of FIG. 1.

$$J_p = \sum_{q=1}^{n} (1-Sc)J_q F_{pq} + J_{gp}$$

Returning to FIG. 1, by solving n simultaneous linear equations having n variables thus obtained for each string, the net flux $J_i$ is determined for each string at Step S105, followed by the deposition speed calculation at Step S106 and the string model revision at Step S107.

As heretofore described, deposition profile simulation of an axis symmetric structure is performed with a high speed and a high accuracy, according to the embodiment, making use of analytical integration both in the calculation of direct flux from the gas phase and in the calculation of the shape factors describing contribution of re-emitted flux exchanged among surface points.

What is claimed is:

1. A method of deposition profile simulation applied for estimating profile evolution of an axis-symmetrical structure in a CVD (Chemical Vapor Deposition) process, said method comprising the steps of:

calculating a starting angle and an ending angle, said starting angle and said ending angle representing a maximum value and a minimum value, respectively, of an elevation angle with which said gas phase is visible from said surface point, said elevation angle representing an angle of a plane including said surface point relative to a center axis of said axis-symmetrical structure;

numerically integrating direct flux incident onto said surface point from said gas phase by calculating and accumulating a differential component of said direct flux corresponding to each value of said elevation angle from said starting angle to said ending angle, said differential component being calculated making use of an analytical function of said elevation angle, coordinates of said surface point, coordinates of a circumference shadowing said differential component, and a surface direction at said surface point; and calculating a multiplicity of shape factors in an axis-symmetrical structure, wherein each said shape factor is calculated from one of a multiplicity of pairs of surface points wherein a flux is re-emitted from a first point in said one of a multiplicity of pairs and incident to a second point in said one of a multiplicity of pairs; and using said flux density and said multiplicity of shape factors to provide a deposition profile of an axis symmetrical structure.

2. A method of deposition profile simulation applied for estimating profile evolution of an axis-symmetrical structure in a CVD (Chemical Vapor Deposition) process, said method comprising the steps of:

calculating a visible arc angle representing an angle of a line including an end of a visible arc and perpendicular to a center axis of said axis-symmetrical structure relative to a first plane including said second surface point and said center axis, said visible arc being a visible part, from said second surface point, of a circumference of said axis-symmetrical structure sectioned with a second plane perpendicular to said center axis and including said first surface point;

calculating a facing arc angle representing an angle of a line including an end of a facing arc and perpendicular to said center axis relative to said first plane, said facing arc being a part of said circumference where a scalar product of a surface direction of said first surface point and a vector from said second surface point to said first surface point and a scalar product of a surface direction of said second surface point and a vector from said first surface point to said second surface point are both positive;

determining a smaller value of said visible arc angle and said facing arc angle as an arc angle; and calculating said each of space factor making use of an analytical function of said arc angle, coordinates of said first surface point and said second surface point, and surface directions at said first surface point and said second surface points;

calculating a multiplicity of shape factors in an axis-symmetrical structure, wherein each said shape factor is calculated from one of a multiplicity of pairs of surface points wherein a flux is re-emitted from a first point in said one of a multiplicity of pairs and incident to a second point in said one of a multiplicity of pairs; and using said flux density and said multiplicity of shape factors to provide a deposition profile of an axis symmetrical structure.

* * * * *